US012078656B2

(12) United States Patent
Kolski et al.

(10) Patent No.: US 12,078,656 B2
(45) Date of Patent: Sep. 3, 2024

(54) TWO-TERMINATOR RF ADAPTER FOR BACKGROUND/ENVIRONMENT NOISE MEASUREMENT

(71) Applicant: National Technology & Engineering Solutions of Sandia, LLC, Albuquerque, NM (US)

(72) Inventors: Jeffrey Kolski, Albuquerque, NM (US); Erik Hurd, Edgewood, NM (US); Robert L. Kinzel, Livermore, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 260 days.

(21) Appl. No.: 17/399,951

(22) Filed: Aug. 11, 2021

(65) Prior Publication Data

US 2022/0082586 A1   Mar. 17, 2022

Related U.S. Application Data

(60) Provisional application No. 63/077,068, filed on Sep. 11, 2020.

(51) Int. Cl.
| | | |
|---|---|---|
| *G01R 1/04* | (2006.01) |
| *G01R 1/067* | (2006.01) |
| *G01R 31/00* | (2006.01) |
| *G01R 31/52* | (2020.01) |
| *G01R 31/58* | (2020.01) |
| *H04M 1/24* | (2006.01) |
| *H04M 3/28* | (2006.01) |
| *H04M 3/30* | (2006.01) |

(52) U.S. Cl.
CPC ....... *G01R 1/0416* (2013.01); *G01R 1/06788* (2013.01); *G01R 31/002* (2013.01); *G01R 31/52* (2020.01); *G01R 31/58* (2020.01); *H04M 1/24* (2013.01); *H04M 3/28* (2013.01); *H04M 3/30* (2013.01)

(58) Field of Classification Search
CPC ................ G01R 1/0416; G01R 31/002; G01R 29/0835; G01R 31/52; G01R 31/58; G01R 1/06788; H04M 1/24; H04M 3/28; H04M 3/30
USPC .................................................. 324/550, 555
See application file for complete search history.

(56) References Cited

U.S. PATENT DOCUMENTS

| | | | | |
|---|---|---|---|---|
| 11,624,764 | B1* | 4/2023 | Roberts | G01R 27/28 324/76.39 |
| 2005/0107972 | A1* | 5/2005 | Wong | G01R 27/28 702/107 |
| 2014/0058693 | A1* | 2/2014 | Doubrava | G01R 35/005 702/91 |
| 2014/0097827 | A1* | 4/2014 | Rudaitis | G01R 1/0416 324/126 |
| 2017/0205457 | A1* | 7/2017 | Eriksen | H01R 13/5219 |
| 2018/0188287 | A1* | 7/2018 | Mylsamy | G01R 31/002 |
| 2018/0267129 | A1* | 9/2018 | Belenguer Martinez | G01R 27/28 |

(Continued)

*Primary Examiner* — Raul J Rios Russo
(74) *Attorney, Agent, or Firm* — Kevin W. Bieg

(57) ABSTRACT

A two-terminator RF adapter for background noise measurement in a test environment comprises a system test port comprising a system test port termination and a system test port connector to connect to a system under test; and a data acquisition port, comprising a data acquisition port termination and a data acquisition port connector to connect to a data acquisition system.

7 Claims, 7 Drawing Sheets

(56) References Cited

U.S. PATENT DOCUMENTS

| | | | |
|---|---|---|---|
| 2019/0187175 A1* | 6/2019 | Brush, IV | G01R 1/0416 |
| 2021/0263073 A1* | 8/2021 | Stuart | G01R 13/20 |
| 2021/0293898 A1* | 9/2021 | Eriksen | H01R 13/5219 |
| 2022/0326278 A1* | 10/2022 | Campbell | G01R 27/28 |

* cited by examiner

Table 1. Two-terminator RF adapter connector and termination types

| System Test Port Connector | System Test Port Termination | Data Acquisition Port Termination | Data Acquisition Port Connector |
|---|---|---|---|
| N-Type M/F | Open | Open | N-Type M/F |
| SMA M*/F | Short* | Short | SMA M/F* |
| 3.5 mm M/F | 50 Ω Match | 50 Ω Match* | 3.5 mm M/F |
| 2.92 mm M/F | 75 Ω Match | 75 Ω Match | 2.92 mm M/F |
| 2.4 mm M/F | 100 Ω Match | 100 Ω Match | 2.4 mm M/F |
| 1.85 mm M/F | Custom | Custom | 1.85 mm M/F |

TWO-TERMINATOR RF ADAPTER FOR BACKGROUND/ENVIRONMENT NOISE MEASUREMENT

CROSS-REFERENCE TO RELATED APPLICATION

This application claims the benefit of U.S. Provisional Application No. 63/077,068, filed Sep. 11, 2020, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to RF noise measurements and, in particular, to a two-terminal RF adapter that can be used to measure background noise in a test environment.

BACKGROUND OF THE INVENTION

The background signal is the contribution to a measured signal from a test environment in a test setup and can be likened to the classic cocktail party problem, where the signal of interest is the immediate conversation and the background signal is the din from the cocktail party. The measured signal is what is heard, which is derived from the immediate conversation and the cocktail party environment combined. If the conversation volume is too low or if the cocktail party din is too loud, the measurement signal is dominated by the background signal.

Similarly, the measurement signal in a radio frequency (RF) system characterization test has sources from the actual system response, which is the signal of interest, and the background signal arising from the test environment and setup. When characterizing the system response (identifying sources or resonance or coupling), it is important to qualify the measurement signal to determine if the measurement signal is due to the system or the background. The background can be characterized by removing the contribution of the system response from the measurement signal. Ideally, the measurement probe would be disconnected from the system but left in the same approximate position to measure the influence of the test environment background on the measurement. However, the probes are often located deep inside the system under test and inaccessible during an actual test. System disassembly to disconnect the probe is generally not feasible because of schedule and the perturbation to the system would be too great. Likewise, probe duplicity, one probe for test data and another probe for background data, can be unrealistic due to space constraints, system perturbation, and measurement egression respects. The most convenient and next best location to break the measurement chain is at the system test port. The system test port is the location where the measurement cable interfaces to the system and is typically on the exterior of the system. The internal cabling to the measurement probe connects to the inside of the system test port.

Characterizing the contribution of a test environment in the form of a background signal is a good measurement practice and necessary for determining if the measurement signal is sourced by the system instrumentation response or limited by the test setup. This can be done electrically by breaking the measurement line and inserting a matching impedance termination (typically 50 ohms for most data acquisition equipment). The difficult and time-consuming part of configuring for the background characterization is mechanically fixing and holding the body of a 50-ohm terminator to the body of the capping terminator used on the system test port, as shown in FIG. 1. Good electrical and mechanical contact is necessary to ensure that the coupling drive from the test environment (current coupled onto the measurement cable shield) during the background characterization is the same as that during the actual data measurement. Establishing and maintaining the electrical and mechanical contact is especially difficult considering that the connection between the two terminations may be made at any angle and may have to bear the weight and lever arm of instrumentation equipment. Note that the system under test may undergo evaluation in multiple orientations adding further variability to the connection angle and tension load.

Hose clamps and similar devices have been used in the past to hold the 50-ohm terminator to the capping terminator on the system test port, but the process of instrumenting for the background/environment noise measurement can be tedious and take several hours. Further, this ad-hoc method does not guarantee the electrical connectivity required for a reproducible background signal. Small separation between the terminators can lead to arcing and test hardware damage.

Recently, 3D printed plastic fixturing has been used to snap and hold the 50-ohm terminator and terminator capping the system test port together. While the 3D printed fixtures can reduce instrumentation time from several hours to one hour, the mechanical and electrical contact between the 50-ohm terminator and the capping terminator was sometimes minimal. The snap-and-hold quality of the 3D printed fixture was also not completely compatible with the extremely variable bronze wool wrap around the RF connections to minimize coupling during measurement. The 3D printed clips were also bulky and could not be used in circumstances where several test ports were positioned close together on the system exterior.

SUMMARY OF THE INVENTION

The present invention is directed to a two-terminal RF adapter for background noise measurement in a test environment, comprising a system test port, comprising a system test port termination and a system test port connector to connect to a system under test; and a data acquisition port, comprising a data acquisition port termination and a data acquisition port connector to connect to a data acquisition system. The connectors for the system test port and the data acquisition port can be male or female or a combination of male and female. For example, the termination can comprise an open, short, 50 ohm, 75 ohm, or 100-ohm termination. The adapter can further comprise a through connection for output of a response signal from a system under test and an internal electrical switch to switch the through connection to the system test port termination.

The two-terminal RF adapter of the present invention enables quick instrumentation transition from a system response test configuration to a background/environment noise (with the electromagnetic test environment active) characterization test configuration. This background characterization is different than the usual noise characterization measurement wherein the test environment is not active, which results in a data acquisition limit. Use of the two-terminal RF adapter reduces the transition time between configurations by a factor of approximately 10 compared to other methods, reducing test time and associated costs. The test configuration transition is simple using the two-terminal RF adapter of the present invention. The adapter's simplicity and quick implementation promotes use at test facilities where background characterization, although a best measurement practice, is otherwise impractical due to execution difficulty and test schedule constraints. The adapter increases the accuracy of the background characterization in comparison with previous methods by better reproducing the coupling topology of the test configuration. Use of the two-terminal RF adapter for background characterization is applicable to all electromagnetic environment tests (indoor/outdoor, free field/simulator).

BRIEF DESCRIPTION OF THE DRAWINGS

The detailed description will refer to the following drawings, wherein like elements are referred to by like numbers.

DETAILED DESCRIPTION OF THE INVENTION

The two-terminator RF adapter of the present invention combines two existing technologies, an RF terminator and an RF adapter, and joins them into a single component:
1) RF terminator—a device that caps the end of an RF line in a flat impedance response with respect to frequency and is typically 0 ohms (short), 50 ohms (match), or infinite ohms (open).
2) RF adapter—a device with good transmission properties that converts connector gender (male and female), transitions connector type (size), or does both.

Figure 1:
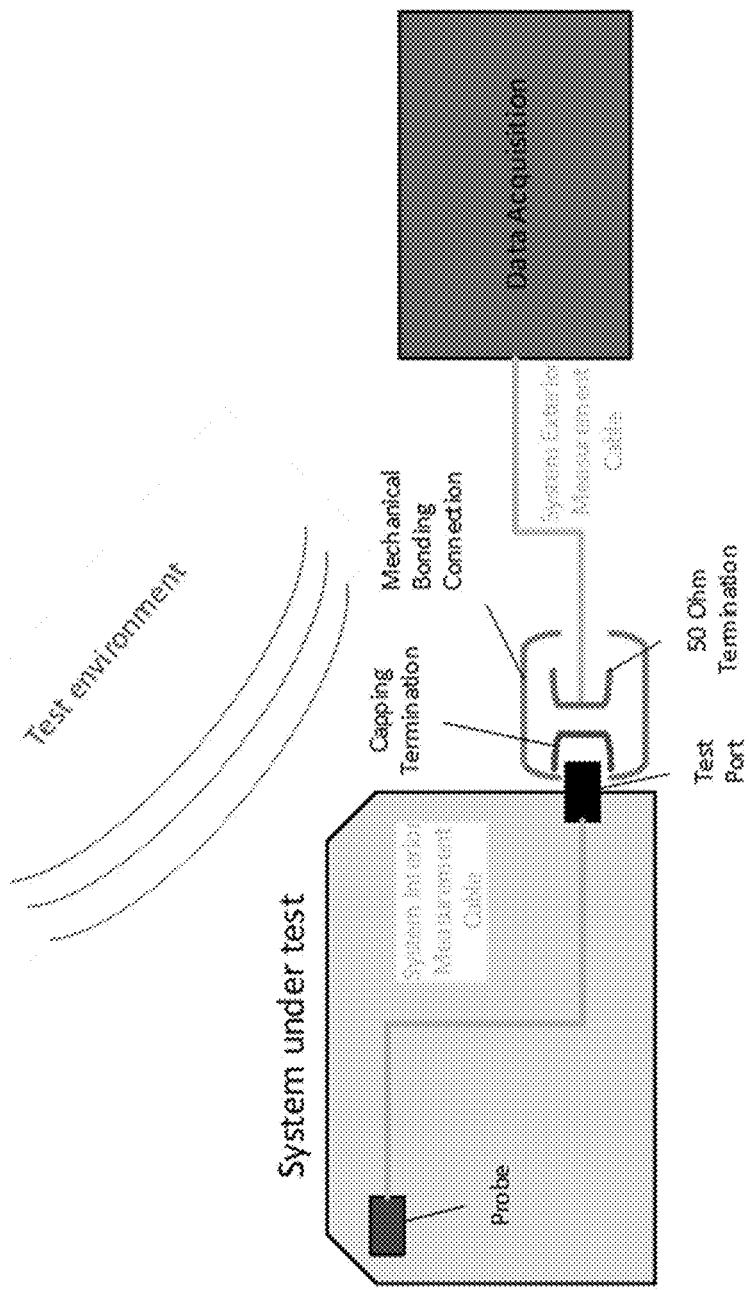
FIG. 1 is a schematic illustration of a two-terminator background characterization test configuration.
Figure 2:
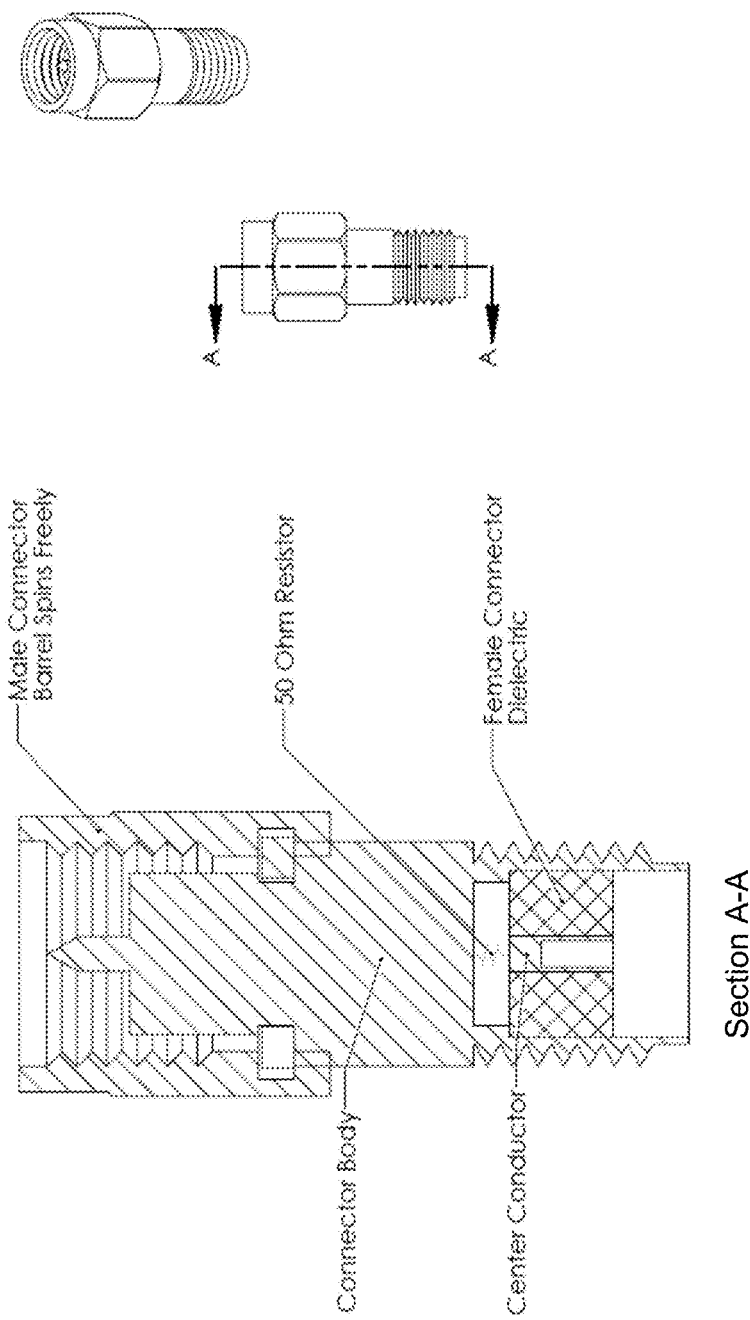
FIG. 2 is a detailed drawing of the two-terminator RF adapter.

FIG. 2 shows a basic mechanical drawing of an exemplary two-terminator RF adapter of the present invention, with a 50-ohm termination on the bottom port (the data acquisition side) and a short termination on the top port (the system side of the adapter). The adapter is mechanically a single piece with a continuous shield topology like that of an existing RF adapter. However, unlike existing RF adapters, the signal transmission of the two-terminator RF adapter is blocked by two RF terminators, one for each port, to enable background noise measurement.

The two-terminator RF adapter comprises four subcomponents: two connectors and two terminations. There is a connector and termination set for each port of the adapter. One port faces the data acquisition equipment, and the other port faces the system test port. Any combination of these four subcomponents can be used to form the adapter. The possible connector types and terminations for each subcomponent are given in Table 1. The M/F under connector type indicates connector gender, and the * indicates connector and termination selections used in the adapters fabricated as examples of the invention.

The two-terminator RF adapter connector type is dictated by the frequency spectrum of the test. As an example, system characterization tests that assess to a maximum frequency of 40 GHz will need 2.92 mm connectors, which are smaller than the SMA connectors used in the invention example, to avoid signal contamination by non-TEM modes. The adapter connector gender is dependent on the genders of the measurement cable and the system test port. Typically, but not always, the system test port gender is female, requiring the system test port connector of the adapter to be male and the data acquisition connector of the adapter to be female.

The termination on the data acquisition port of the adapter should match the impedance of the data acquisition system, usually 50 ohms, although the impedance can be 100 ohms for some balanced lines with a balun device in the measurement line. A 75 ohm termination may be appropriate for video systems. Matching the data acquisition impedance is important to avoid standing wave resonance (cable length and frequency effect) contributions to the background characterization.

The test port termination is somewhat arbitrary with respect to the background characterization but may be important with respect of the system under test, especially if the probe is in direct contact with a system circuit. As an example, using a short termination on the system test port side of the adapter could result in a large current drive to the system circuit under test. Similar considerations are important with open terminations and voltage sensitive system circuits with direct contact probes.

Figure 3A:
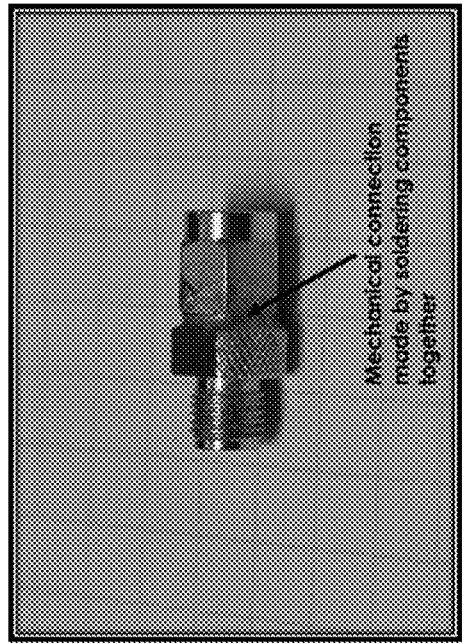
FIG. 3A is a photograph of an exemplary two-terminator RF adapter.
Figure 3B:
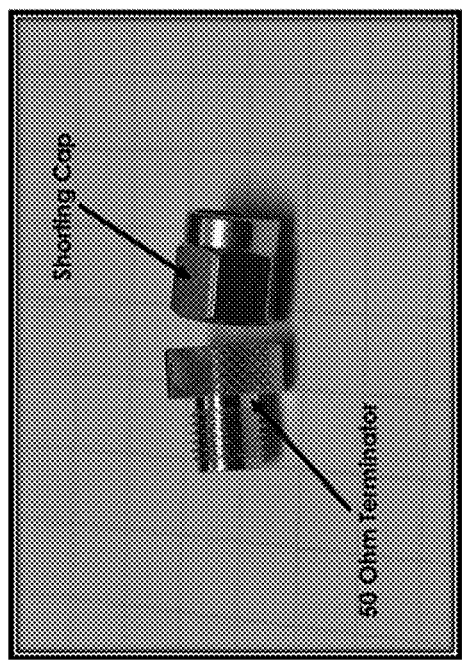
FIG. 3B is a photograph of the constituent parts of the exemplary two-terminator RF adapter.

FIGS. 3A and 3B are photographs of an exemplary two-terminator RF adapter. Two RF terminations (a 50-ohm terminator with a female SMA connector and a short termination with a male SMA connector) were mechanically bounded together with solder. Alternatively, the adapter could be contained in a machined RF adapter body.

Figure 4:
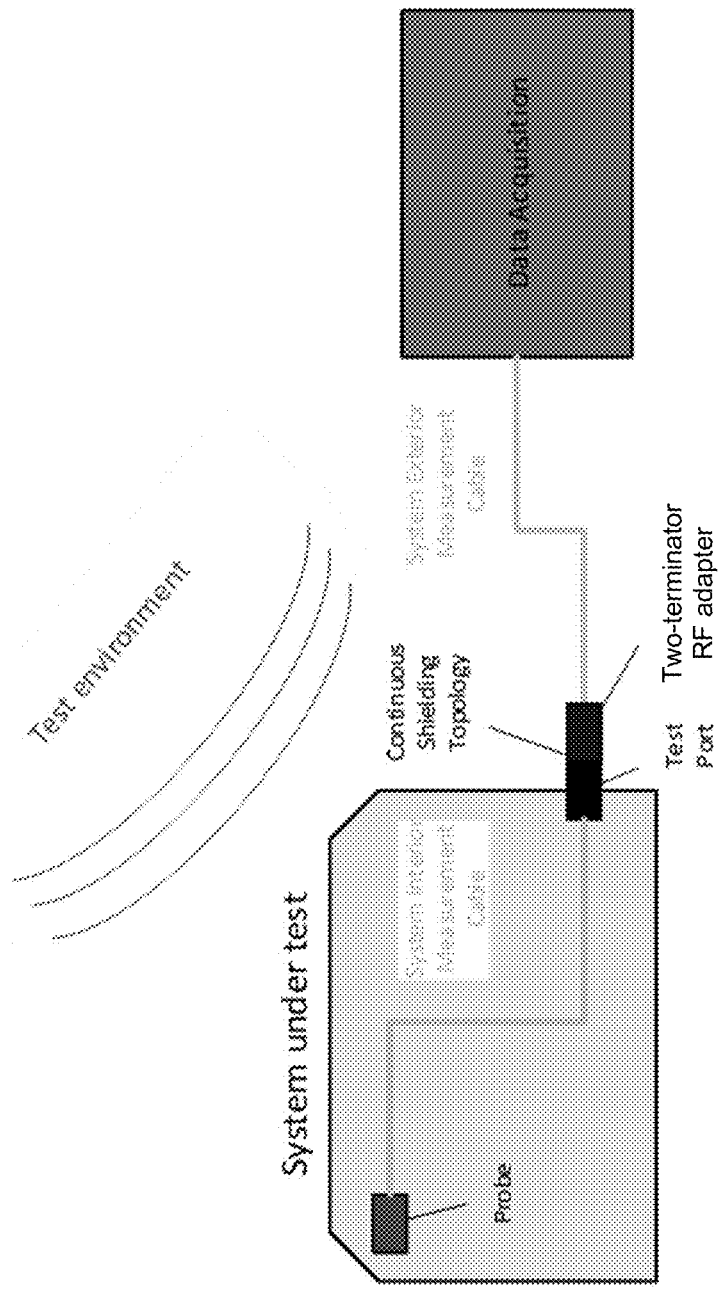
FIG. 4 is a schematic illustration of the two-terminator RF adapter installed in an example test setup.

The two-terminator RF adapter of the present invention is designed to be installed in the measurement line. Closer to the measurement probe is preferred because contributions from more of the measurement line are included in the background characterization. Since probes are often instrumented within systems and inaccessible during test, the best practical location to place the adapter is between the test port on the system exterior and the system external measurement cable, as shown in FIG. 4.

The two-terminator RF adapter also solves the mechanical problem of establishing and maintaining electric contact between the 50-ohm terminator on the data acquisition side of the adapter and the capping termination on the system side. This is accomplished by design because the two-terminator RF adapter integrates the two terminations into a single component. The flow of test environment coupled current to the measurement cable shields is unperturbed by introducing the two-terminator RF adapter to the measurement line, which leads to a better fidelity background characterization.

The two-terminator RF adapter has integrated connectors that match the measurement cable and system test port interfaces. Therefore, installing the adapter in the measurement line is as simple as installing a second cable, connector-type adapter, attenuator, or connecting to the data acquisition:

1) Disconnect the system exterior measurement cable from the system test port.
2) Connect the two-terminator RF adapter to the system test port.
3) Connect the system exterior measurement cable to the adapter.

Figure 5:
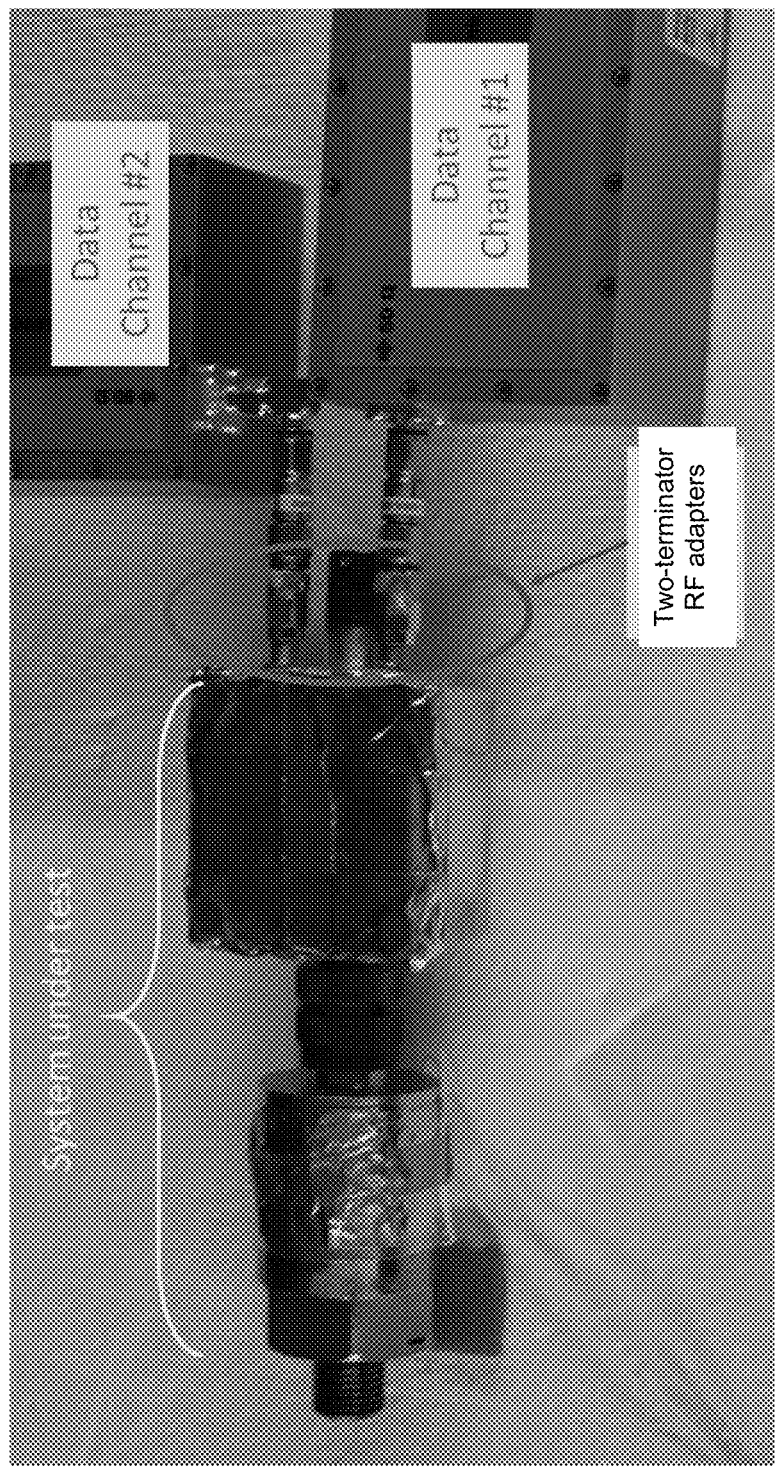
FIG. 5 is a photograph of two, two-terminator RF adapters installed for background characterization.

Removing the adapter is just as simple by undoing the above steps in reverse order. Because the adapter is easy to use and is designed to integrate with measurement cables and test ports, installing the adapter to transition from a data test configuration to a background characterization test configuration or vice versa takes the same amount of time and effort as adding or removing an attenuator from the measurement line, which is a common operation during test. FIG. 5 shows an example of two-terminator RF adapters installed in the measurement line for a background characterization.

Another embodiment of two-terminator RF adapter further comprises an internal electrical switch to transition a throughput from the system test port to the termination. The switch could be controlled locally/mechanically or remotely. There are two advantages of this embodiment. First, the adapter component (which now includes a through connection for data measurement and a termination for background characterization) is installed in the measurement line prior to test. The measurement line is unperturbed mechanically by switching to the background characterization. A second advantage is a huge increase in efficiency and reduction in time required to transition from the data measurement to the background characterization and back, which is just a flip of a switch. Another embodiment integrates the adapter into a fiber optic data link (ODL). A switch internal to the ODL transmitter can be controlled remotely and commanded to the two-terminator RF adapter channel for the background characterization. Using electrical switches to transition from a data test configuration to a background test configuration takes less than a second and makes this technology very attractive at industry test sites.

Figure 6:
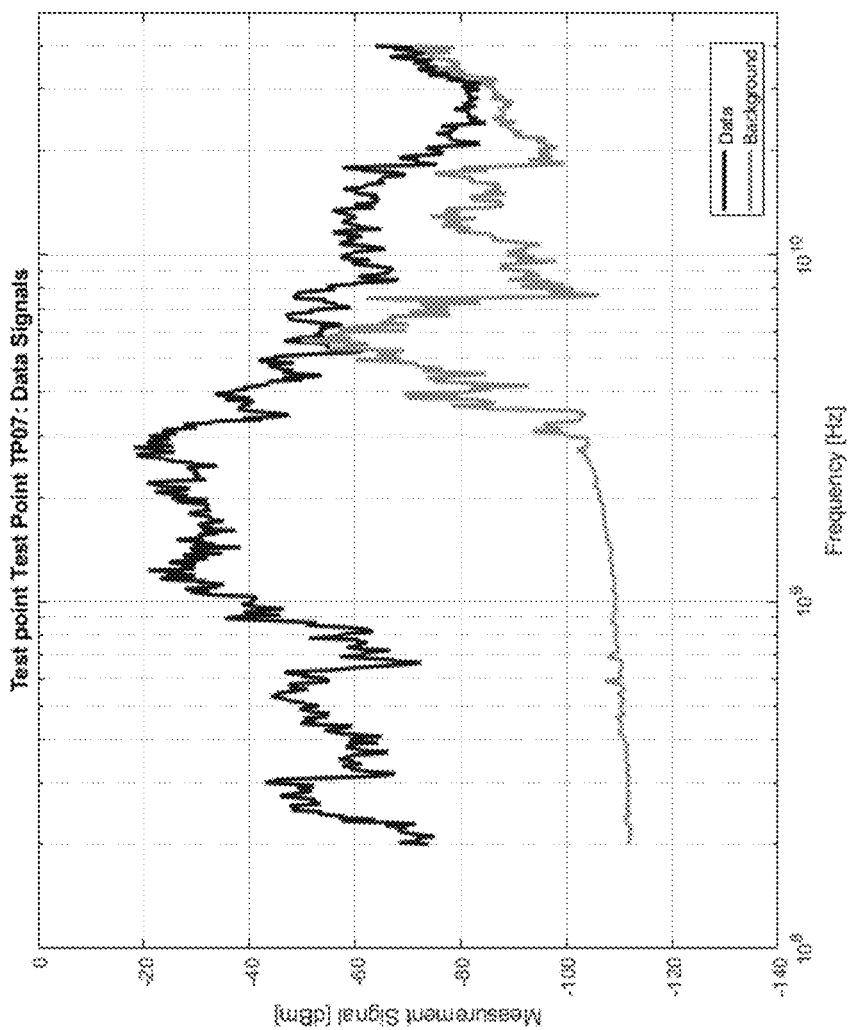
FIG. 6 is a graph of intermittent background limited data.
Figure 7:
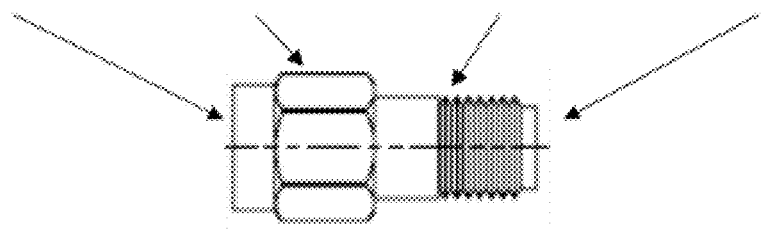
FIG. 7 is a table showing two-terminator RF adapter connector and termination types.

FIG. 6 shows an example of a system response during test. The measurement signal is shown in blue. The measurement data was collected with the measurement line connected directly to the probe and without the two-terminator RF adapter installed in the measurement line. The measurement data has contributions from both the system response and the test environment background. The background signal is shown in green. This background data was collected with the two-terminator RF adapter installed at the test port on the system under test. The background characterization does not include contributions from the probe (system response) and is only due to the test environment. The signal due to the test environment (background) is much lower than the measurement signal for most of the test frequency bandwidth (200 MHz-40 GHz). This indicates that the system response dominates the measurement signal. (Note dBm units are logarithmic, a 10 dBm difference is a factor of 10, a 20 dBm difference is a factor of 100, etc. . . . ). However, at frequencies in the range 5-6 GHz and above 30 GHz, the measurement signal and the background signal are almost the same. In these regions, the measurement signal is dominated by signal due to the background. The actual system response is smaller than the background and was not resolved by the measurement alone.

The present invention has been described as a two-terminator RF adapter. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A two-terminator RF adapter for background noise measurement in a test environment, comprising:
    a system test port, comprising a system test port termination and a threaded system test port connector to connect to a system under test; and
    a data acquisition port, comprising a data acquisition port termination and a threaded data acquisition port connector to connect to a data acquisition system;
    wherein the system test port and the data acquisition port mechanically form a single piece with a continuous shield topology.

2. The two-terminator RF adapter of claim 1, wherein the threaded system test port connector comprises a male connector and the threaded data acquisition port connector comprises a female connector.

3. The two-terminator RF adapter of claim 1, wherein the threaded system test port connector comprises a female connector and the threaded data acquisition port connector comprises a male connector.

4. The two-terminator RF adapter of claim 1, wherein the threaded system test port connector and the threaded data acquisition port connector are either both male connectors or both female connectors.

5. The two-terminator RF adapter of claim 1, wherein the system test port termination comprises an open, short, 50 ohm, 75 ohm, or 100-ohm termination.

6. The two-terminator RF adapter of claim 1, wherein the data acquisition port termination comprises an open, short, 50 ohm, 75 ohm, or 100-ohm termination.

7. The two-terminator RF adapter of claim 1, wherein the two-terminator RF adapter further comprises a through connection for output of a response signal from the system under test and an internal electrical switch to switch the through connection to the system test port termination.

* * * * *